(12) United States Patent
Okuda

(10) Patent No.: US 7,830,931 B2
(45) Date of Patent: Nov. 9, 2010

(54) SEMICONDUCTOR LASER EXCITATION SOLID LASER DEVICE AND AN IMAGE FORMATION DEVICE HAVING THE SAME

(75) Inventor: Keiji Okuda, Osaka (JP)

(73) Assignee: STC Inc., Osaka (JP)

( * ) Notice: Subject to any disclaimer, the term of this patent is extended or adjusted under 35 U.S.C. 154(b) by 20 days.

(21) Appl. No.: 11/916,400

(22) PCT Filed: Jun. 1, 2006

(86) PCT No.: PCT/JP2006/310994

§ 371 (c)(1),
(2), (4) Date: Jan. 6, 2009

(87) PCT Pub. No.: WO2006/129757

PCT Pub. Date: Dec. 7, 2006

(65) Prior Publication Data

US 2009/0116517 A1    May 7, 2009

(30) Foreign Application Priority Data

Jun. 2, 2005   (JP) ............... 2005-190577
Jan. 23, 2006  (JP) ............... 2006-041588

(51) Int. Cl.
*H01S 3/13* (2006.01)
(52) U.S. Cl. .............. 372/29.02; 372/21; 372/22; 372/25; 372/27; 372/29.01; 372/69; 372/70; 372/71; 372/72
(58) Field of Classification Search ................ 372/21, 372/22, 25, 27, 29.02, 29.01, 69, 70, 71, 372/72
See application file for complete search history.

(56) References Cited

U.S. PATENT DOCUMENTS 5,038,352 A * 8/1991 Lenth et al. .............. 372/21

(Continued)

FOREIGN PATENT DOCUMENTS

JP    60-153187 A    8/1985

(Continued)

OTHER PUBLICATIONS

International Search Report of PCT/JP2006/310994, date of mailing Sep. 12, 2006.

*Primary Examiner*—Minsun Harvey
*Assistant Examiner*—Yuanda Zhang
(74) *Attorney, Agent, or Firm*—Westerman, Hattori, Daniels & Adrian, LLP

(57) ABSTRACT

A semiconductor laser excitation solid laser control device 1A according to the present invention is a control device for stabilizing a light quantity of an output light LO of a semiconductor laser excitation solid laser 2. The control device 1A comprises: a beam splitter 11A for branching a laser light emitted from the semiconductor laser excitation solid laser 2 into the output light LO and a control light LC; a light reception element 12 for detecting the light quantity of the control light LC branched by the beam splitter 11A; and control means 13 for controlling the light quantity of the laser light emitted from the semiconductor laser excitation solid laser 2 so that the light quantity detected by the light reception element 12 will be constant. The beam splitter 11A has a transmittance and a reflectivity not depending on the polarization characteristic of the laser light.

6 Claims, 2 Drawing Sheets

U.S. PATENT DOCUMENTS

| | | | |
|---|---|---|---|
| 5,325,381 A * | 6/1994 | Paoli | 372/24 |
| 5,671,232 A * | 9/1997 | Lee et al. | 372/22 |
| 5,856,994 A * | 1/1999 | Hayakawa | 372/75 |
| 6,795,475 B1 * | 9/2004 | Ohtsuka et al. | 372/92 |
| 7,145,924 B2 * | 12/2006 | Tojo et al. | 372/21 |
| 2004/0066807 A1 * | 4/2004 | Kasazumi et al. | 372/22 |
| 2004/0190583 A1 * | 9/2004 | Tojo et al. | 372/98 |

FOREIGN PATENT DOCUMENTS

| | | |
|---|---|---|
| JP | 60-261183 A | 12/1985 |
| JP | 61-53959 U | 4/1986 |
| JP | 4-231825 A | 8/1992 |
| JP | 5-29695 A | 2/1993 |
| JP | 2000-305344 A | 10/2002 |

* cited by examiner

SEMICONDUCTOR LASER EXCITATION SOLID LASER DEVICE AND AN IMAGE FORMATION DEVICE HAVING THE SAME

TECHNICAL FIELD

The present invention relates to a semiconductor laser excitation solid laser device having a control device for stabilizing a light quantity of an output light of a semiconductor laser excitation solid laser, and an image formation device having the same.

BACKGROUND ART

In recent years, a semiconductor laser excitation solid laser using a semiconductor laser as an excitation light source of a solid laser is attracting people's attention. In particular, a semiconductor laser excitation solid laser emitting a laser light of green color (wavelength: 532 nm) is expected as a replacement light source of a semiconductor laser because a semiconductor laser emitting a laser light of green color is not realized yet.

A semiconductor laser excitation solid laser emitting a laser light of green color is used for various purposes such as a measurement apparatus, a guide light of an infrared laser, marking for positioning, and the like by utilizing the property that the spectral luminous efficiency of green color is extremely high. Also, in recent years, it is expected to be used as a green color light source of various image formation devices such as a color projector, a color projection television set and the like.

In general, not only the above-described semiconductor laser excitation solid lasers emitting a laser light of green color but also the semiconductor laser excitation solid lasers emitting a laser light having various wavelengths desirably have a stable light quantity of the output light thereof irrespective of the purposes for which they are used. In particular, when a semiconductor laser excitation solid laser is used as a light source of an image formation device as be described above, it is strongly desired that the light quantity of the output light is stabilized because the light quantity of the output light directly affects the color reproducibility or the like of the image formation device.

For this reason, Japanese Patent Application Laid-Open (JP-A) No. 10-93166, for example, proposes a technique of stabilizing a light quantity of an output light by branching the laser light emitted from a semiconductor laser excitation solid laser into the output light and a control light with use of a beam splitter, and controlling the light quantity of the laser light emitted from the semiconductor laser excitation solid laser (controlling the driving current of the semiconductor laser) in accordance with the light quantity of the control light detected by a light reception element (so that the detected light quantity will be constant).

However, even if the technique disclosed in JP-A No. 10-93166 is applied, a phenomenon occurs such that the light quantity of the output light of the semiconductor laser excitation solid laser is not sufficiently stabilized when it is accompanied by an environmental change such as a temperature change. For this reason, as a realistic means for sufficiently stabilizing the light quantity of the output light, there is a need to maintain the temperature of the semiconductor laser excitation solid laser to be constant with use of a suitable temperature controller. This accompanies an increase in the scale of the apparatus as a whole or a rise of the costs, thereby raising a problem of being unpracticable.

DISCLOSURE OF THE INVENTION

The present invention has been made in view of solving such problems of the conventional art, and an object thereof is to provide a semiconductor laser excitation solid laser device having a control device capable of stabilizing the light quantity of the output light of a semiconductor laser excitation solid laser even when it is accompanied by an environmental change such as a temperature change, as well excitation an image formation device having the same.

In order to solve the above-described object, the inventor of the present invention has made eager studies and, as a result of this, has found out that the major factors by which the light quantity of the output light of the semiconductor laser excitation solid laser becomes unstable when it is accompanied by an environmental change such as a temperature change are (1) that the polarization characteristic of the laser light emitted from the semiconductor laser excitation solid laser changes in accordance with the environmental change such as a temperature change, and (2) that a beam splitter generally put to use has a varying transmittance or reflectivity in accordance with the polarization characteristic of the incident light.

In other words, when the polarization characteristic of the laser light emitted from the semiconductor laser excitation solid laser changes in accordance with the environmental change such as a temperature change, the light quantity ratio of the output light branched by a general beam splitter (for example, the light transmitted through the beam splitter) to the control light (for example, the light reflected by the beam splitter) changes. Therefore, even if the light quantity of the laser light emitted from the semiconductor laser excitation solid laser is controlled so that the light quantity of the control light will be constant, the output light will not stabilized.

Therefore, the present inventor has conceived an idea of means in which the light quantity ratio of the output light to the control light does not change even when the polarization characteristic of the laser light emitted from the semiconductor laser excitation solid laser changes, the above-described problems can be solved and, as a result of further eager studies, has completed the present invention.

Accordingly, in order to solve the above-described object, the present invention provides a semiconductor laser excitation solid laser device, comprising: a semiconductor laser excitation solid laser with use of a non-linear optical crystal; and a control device for stabilizing a light quantity of an output light of the semiconductor laser excitation solid laser, wherein the control device comprises a beam splitter for branching a laser light, which is emitted from the semiconductor laser excitation solid laser and is converted into a harmonics wave with use of the non-linear optical crystal, into the output light and a control light, the beam splitter having a transmittance and a reflectivity not depending on the polarization characteristic of the laser light; a light reception element for detecting the light quantity of the control light branched by the beam splitter; and control means for controlling the light quantity of the laser light emitted from the semiconductor laser excitation solid laser so that the light quantity detected by the light reception element will be constant.

Here, in the present invention, the phrase "a transmittance and a reflectivity not depending on the polarization characteristic of the laser light" means that the ratio of the obtained minimum transmittance to the obtained maximum transmittance is 0.8 or higher (preferably 0.95 or higher) and that the ratio of the obtained minimum reflectivity to the obtained maximum reflectivity is 0.8 or higher (preferably 0.95 or higher) when a light having the same wavelength as the laser light emitted from the semiconductor laser excitation solid laser is let to be incident into the beam splitter by changing the polarization direction thereof to various directions.

According to the present invention, a beam splitter having a transmittance and a reflectivity not depending on the polarization characteristic of the laser light is used as the beam splitter for branching the laser light emitted from the semiconductor laser excitation solid laser into an output light and a control light. Therefore, even when the polarization characteristic of the laser light emitted from a semiconductor laser excitation solid laser (namely, the laser light incident into the beam splitter) changes by a temperature change or the like, the light quantity ratio of the output light (for example, the light transmitted through the beam splitter) to the control light (for example, the light reflected by the beam splitter) will be approximately constant because the transmittance and the reflectivity are not dependent on the polarization characteristic. Therefore, when the light quantity of the laser light emitted from the semiconductor laser excitation solid laser is controlled by the controlling means so that the light quantity of the control light detected by the light reception element will be constant, the light quantity of the output light, which has an approximately constant light quantity ratio to the control light, can be stabilized to be approximately constant.

Further, according to the present invention, it is sufficient to replace a general beam splitter constituting a conventionally proposed control device with the beam splitter having a transmittance and a reflectivity not dependent on the polarization characteristic of the laser light, thereby eliminating the need for other additional optical devices. Therefore, the control device can be made to have a scale as small as a conventional one, and also the space between the semiconductor laser excitation solid laser and the beam splitter can be made small, thereby advantageously facilitating adjustment of the optical axis.

Also, in order to solve the above-described object, the present invention provides a semiconductor laser excitation solid laser device, comprising: a semiconductor laser excitation solid laser with use of a non-linear optical crystal; and a control device for stabilizing a light quantity of an output light of the semiconductor laser excitation solid laser, wherein the control device comprises a linear polarizer for taking out a linearly polarized light from a laser light emitted from the semiconductor laser excitation solid laser and converted into a harmonics wave with use of the non-linear optical crystal; a beam splitter for branching a light transmitted through the linear polarizer into the output light and a control light; a light reception element for detecting the light quantity of the control light branched by the beam splitter; and control means for controlling the light quantity of the laser light emitted from the semiconductor laser excitation solid laser so that the light quantity detected by the light reception element will be constant.

According to the present invention, a linear polarizer for taking out a linearly polarized light from the laser light emitted from the semiconductor laser excitation solid laser is provided, and the light transmitted through the linear polarizer is branched into an output light and a control light by the beam splitter. Therefore, even when the polarization characteristic of the laser light emitted from a semiconductor laser excitation solid laser changes by a temperature change or the like, the light quantity ratio of the output light (for example, the light transmitted through the beam splitter) to the control light (for example, the light reflected by the beam splitter) will be approximately constant because the light incident into the beam splitter is a light having a constant polarization direction that has been transmitted through the linear polarizer, and the transmittance and the reflectivity of the beam splitter are constant relative to the above-described light having a constant polarization direction. Therefore, when the light quantity of the laser light emitted from the semiconductor laser excitation solid laser is controlled by the controlling means so that the light quantity of the control light detected by the light reception element will be constant, the light quantity of the output light, which has an approximately constant light quantity ratio to the control light, can be stabilized to be approximately constant.

Further, according to the present invention, a general beam splitter constituting a conventionally proposed control device can be used, thereby advantageously restraining rise in the production costs of the control device.

Here, in the present invention, after a linearly polarized light is taken out by the linear polarizer from the laser light emitted from the semiconductor laser excitation solid laser, the linearly polarized light may be converted into a circularly polarized light or an elliptically polarized light by a suitable retardation plate, so as to be incident into the beam splitter, whereby functions and effects similar to those described above will be exhibited.

Further, in order to solve the above-described object, the present invention provides a semiconductor laser excitation solid laser device, comprising: a semiconductor laser excitation solid laser with use of a non-linear optical crystal; and a control device for stabilizing a light quantity of an output light of the semiconductor laser excitation solid laser, wherein the control device comprises a beam splitter for branching a laser light, which is emitted from the semiconductor laser excitation solid laser and is converted into a harmonics wave with use of the non-linear optical crystal, into a first light and a second light; a first linear polarizer for taking out a linearly polarized light from the first light branched by the beam splitter to form a control light; a second linear polarizer for taking out a linearly polarized light from the second light branched by the beam splitter to form the output light, a polarization direction of the first linear polarizer and a polarization direction of the second linear polarizer being identical to each other; a light reception element for detecting the light quantity of the control light transmitted through the first linear polarizer; and control means for controlling the light quantity of the laser light emitted from said semiconductor laser excitation solid laser so that the light quantity detected by said light reception element will be constant.

According to the present invention, after the laser light emitted from the semiconductor laser excitation solid laser is branched into a first light and a second light by the beam splitter, light having the same polarization direction with each other is taken out respectively from the first light by the first linear polarizer and from the second light by the second linear polarizer so as to form a control light and an output light, respectively. Therefore, even when the polarization characteristic of the laser light emitted from a semiconductor laser excitation solid laser changes by a temperature change or the like, the output light (for example, the light transmitted through the second linear polarizer after being transmitted through the beam splitter) and the control light (for example, the light transmitted through the first linear polarizer after being reflected by the beam splitter) will have the same polarization direction with each other, so that the light quantity ratio of the output light to the control light will be approximately constant because the transmittance and the reflectivity of the beam splitter are constant relative to the above-described light having the same polarization direction. Therefore, when the light quantity of the laser light emitted from the semiconductor laser excitation solid laser is controlled by the controlling means so that the light quantity of the control light detected by the light reception element will be constant, the light quantity of the output light, which has an approximately constant light quantity ratio to the control light, can be stabilized to be approximately constant.

Further, according to the present invention, a general beam splitter constituting a conventionally proposed control device, can be used, thereby advantageously restraining rise in the production costs of the control device. Further, there is no need to dispose an optical device between the semiconductor laser excitation solid laser and the beam splitter, and the space between them can be made small, thereby advantageously facilitating adjustment of the optical axis.

Here, in the present invention, after a linearly polarized light is taken out from the first light by the first linear polarizer and a linearly polarized light is taken out from the second light by the second linear polarizer, each of the linearly polarized light may be respectively converted into a circularly polarized light or an elliptically polarized light by a suitable retardation plate, whereby functions and effects similar to those described above will be exhibited.

Further, the present invention provides an image formation device comprising any one of the above-described semiconductor laser excitation solid laser devices.

As described above, according to the present invention, even when the polarization characteristic of the laser light emitted from the semiconductor laser excitation solid laser changes in accordance with a temperature change or the like, the light quantity ratio of the output light to the control light can be made to be approximately constant. Therefore, when the light quantity of the laser light emitted from the semiconductor laser excitation solid laser is controlled by the controlling means so that the light quantity of the control light detected by the light reception element will be constant, the light quantity of the output light, which will have an approximately constant light quantity ratio to the control light, can be stabilized to be approximately constant.

BEST MODE FOR CARRYING OUT THE INVENTION

Hereafter, embodiments of the present invention will be described with reference to the attached drawings.

First Embodiment

Figure 1:
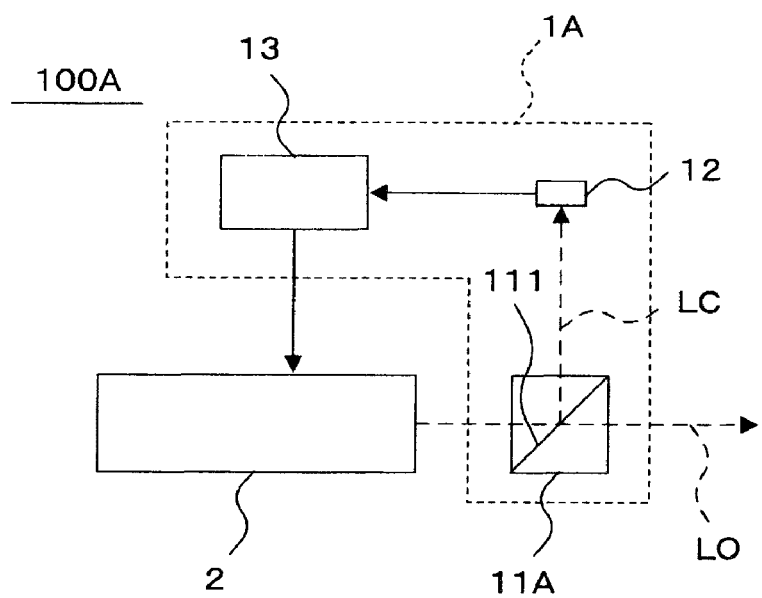
FIG. 1 is a block diagram showing a schematic construction of a semiconductor laser excitation solid laser device according to a first embodiment of the present invention.

FIG. 1 is a block diagram showing a schematic construction of a semiconductor laser excitation solid laser device according to a first embodiment of the present invention. As shown in FIG. 1, the semiconductor laser excitation solid laser device 100A according to the present embodiment comprises a control device 1A and a semiconductor laser excitation solid laser 2. The control device 1A comprises a beam splitter 11A for branching a laser light emitted from the semiconductor laser excitation solid laser 2 into an output light LO and a control light LC; a light reception element 12 for detecting the light quantity of the control light LC branched by the beam splitter 11A; and control means 13 for controlling the light quantity of the laser light emitted from the semiconductor laser excitation solid laser 2 so that the light quantity detected by the light reception element 12 will be constant.

The beam splitter 11A according to the present embodiment has a transmittance and a reflectivity not depending on the polarization characteristic of the laser light. Specifically, the ratio of the obtained minimum transmittance to the obtained maximum transmittance is 0.8 or higher and the ratio of the obtained minimum reflectivity to the obtained maximum reflectivity is 0.8 or higher when a light having the same wavelength as the laser light emitted from the semiconductor laser excitation solid laser 2 is let to be incident into the beam splitter 11A by changing the polarization direction thereof to various directions. Here, the stability of the light quantity of the output light LO changes depending on what values these ratios will be set. Therefore, specific numerical values of the above-described ratios may be suitably set in accordance with the stability that is needed according to various purposes of use of the semiconductor laser excitation solid laser device 100A. Such a beam splitter 11A is generally known as a non-polarization beam splitter, and can be fabricated by laminating two or more kinds of two or more layers of optical thin film on a reflecting/transmitting surface 111 thereof, and suitably designing the film thickness of each layer so that the transmittance/reflectivity of the S-polarized light and the P-polarized light at the laminated film will be equivalent to each other.

As described above, the beam splitter 11A according to the present embodiment has a transmittance and a reflectivity not depending on the polarization characteristic of the laser light. Therefore, even when the polarization characteristic of the laser light emitted from the semiconductor laser excitation solid laser 2 changes by a temperature change or the like, the light quantity ratio of the output light LO (in the present embodiment, the light transmitted through the beam splitter 11A) to the control light LC (in the present embodiment, the light reflected by the beam splitter 11A) will be approximately constant.

The kind of the light reception element 12 is not particularly limited as long as it has sensitivity to the light having the same wavelength as the above-described laser light and exhibits a photoelectric conversion function; however, a photodiode can be suitably used, for example.

As described above, the control means 13 controls the light quantity of the laser light emitted from the semiconductor laser excitation solid laser 2 so that the light quantity detected by the light reception element 12 will be constant. More specifically described, the controlling means 13 compares the output signal from the light reception element 12 (an electric signal that accords to the magnitude of the light quantity as detected by the light reception element 12) with a predetermined standard signal. When the output signal is smaller than the standard signal, the controlling means 13 increases the electric current value that is passed through the semiconductor laser constituting the semiconductor laser excitation solid laser 2. This increases the light quantity of the laser light emitted from the semiconductor laser excitation solid laser 2 and, in accordance therewith, the light quantity of the output light LO and the control light LC will increase. On the other hand, when the output signal from the light reception element 12 is larger than the standard signal, the controlling means 13 decreases the electric current value that is passed through the above-described semiconductor laser. This decreases the light quantity of the laser light emitted from the semiconductor laser excitation solid laser 2 and, in accordance therewith, the light quantity of the output light LO and the control light LC will decrease.

In the above-described manner, the controlling means 13 controls the light quantity of the laser light emitted from the semiconductor laser excitation solid laser 2 (controls the electric current value that is passed through the semiconductor laser) so that the output signal from the light reception element 12 and the standard signal will have an equivalent magnitude (namely, so that the light quantity of the control light LC detected by the light reception element 12 will be constant). Therefore, as described above, the light quantity of the output light LO, which will have an approximately constant light quantity ratio to the control light LC, can be stabilized to be approximately constant.

Second Embodiment

Figure 2:
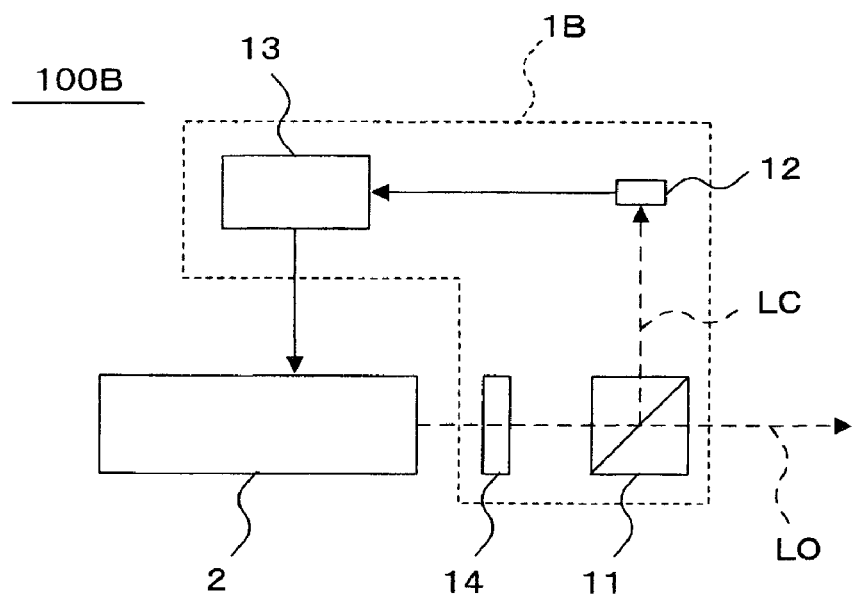
FIG. 2 is a block diagram showing a schematic construction of a semiconductor laser excitation solid laser device according to a second embodiment of the present invention.

FIG. 2 is a block diagram showing a schematic construction of a semiconductor laser excitation solid laser device according to a second embodiment of the present invention. Here, in FIG. 2, elements substantially having the same construction and function as in the first embodiment shown in FIG. 1 are denoted with the same reference symbols, and the detailed description thereof will be omitted. As shown in FIG. 2, the semiconductor laser excitation solid laser device 100B according to the present embodiment comprises a control device 1B and a semiconductor laser excitation solid laser 2. The control device 1B comprises a linear polarizer 14 for taking out a linearly polarized light from a laser light emitted from the semiconductor laser excitation solid laser 2; a beam splitter 11 for branching a light transmitted through the linear polarizer 14 into an output light LO and a control light LC; a light reception element 12 for detecting the light quantity of the control light LC branched by the beam splitter 11; and control means 13 for controlling the light quantity of the laser light emitted from the semiconductor laser excitation solid laser 2 so that the light quantity detected by the light reception element 12 will be constant.

Unlike the beam splitter 11A according to the first embodiment, the beam splitter 11 according to the present embodiment need not have a transmittance and a reflectivity not dependent on the polarization characteristic of the above-described laser light, so that a general beam splitter can be used.

The kind of the linear polarizer 14 is not particularly limited as long as it can take out a linearly polarized light from a light having the same wavelength as the above-described laser light. Here, after the linearly polarized light is taken out by the linear polarizer 14, the above-described linearly polarized light may be converted into a circularly polarized light or an elliptically polarized light by a suitable retardation plate, so as to be incident into the beam splitter 11. In other words, as long as the linear polarizer 14 is disposed on the side nearest to the semiconductor laser excitation solid laser 2, a circular polarizing plate or an elliptic polarizing plate obtained by laminating the linear polarizer 14 and the retardation plate in place of the stand-alone linear polarizer 14 can be used.

As described above, the control device 1B comprises the linear polarizer 14 for taking out a linearly polarized light from the laser light emitted from the semiconductor laser excitation solid laser 2, and the light transmitted through the linear polarizer 14 is branched into the output light LO and the control light LC by the beam splitter 11. Therefore, even when the polarization characteristic of the laser light emitted from the semiconductor laser excitation solid laser 2 changes by a temperature change or the like, the light quantity ratio of the output light LO to the control light LC will be approximately constant because the light incident into the beam splitter 11 is a light having a constant polarization direction that has been transmitted through the linear polarizer 14, and the transmittance and the reflectivity of the beam splitter 11 are constant relative to the above-described light having a constant polarization direction. Therefore, when the light quantity of the laser light emitted from the semiconductor laser excitation solid laser 2 is controlled by the controlling means 13 so that the light quantity of the control light LC detected by the light reception element 12 will be constant, the light quantity of the output light LO, which has an approximately constant light quantity ratio to the control light LC, can be stabilized to be approximately constant.

Third Embodiment

Figure 3:
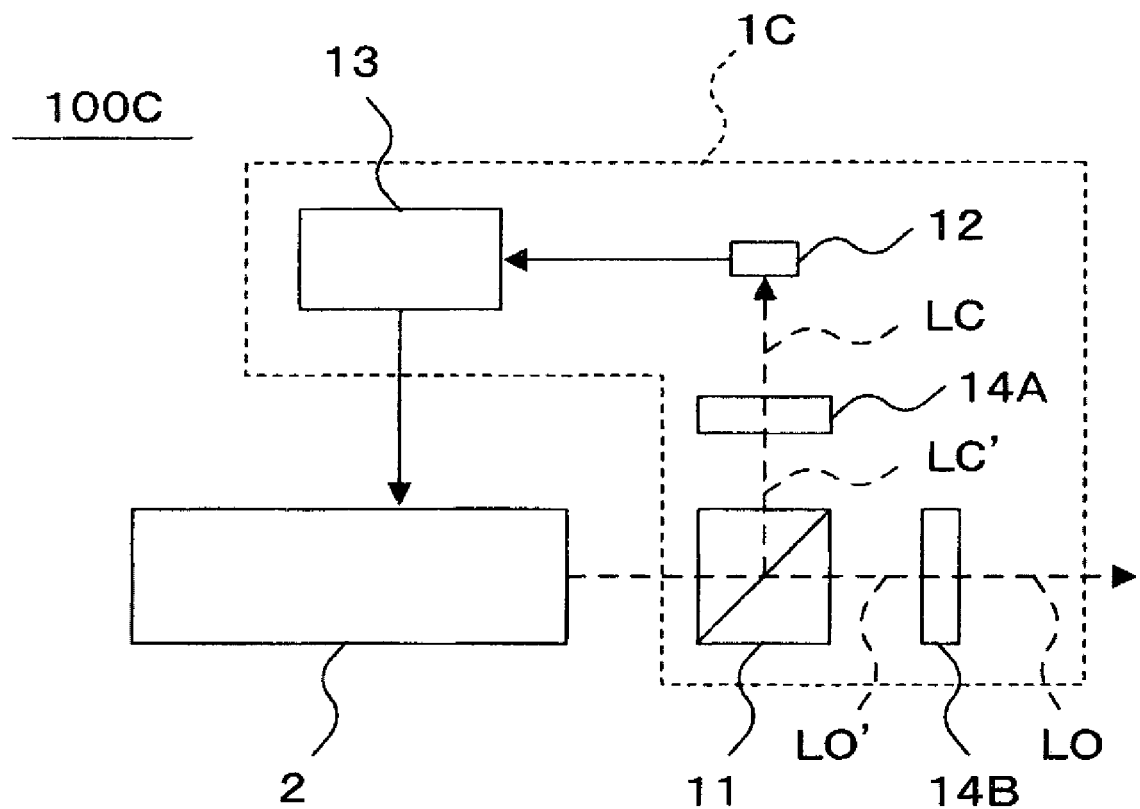
FIG. 3 is a block diagram showing a schematic construction of a semiconductor laser excitation solid laser device according to a third embodiment of the present invention.

FIG. 3 is a block diagram showing a schematic construction of a semiconductor laser excitation solid laser device according to a third embodiment of the present invention. Here, in FIG. 3, elements substantially having the same construction and function as in the first embodiment shown in FIG. 1 or in the second embodiment shown in FIG. 2 are denoted with the same reference symbols, and the detailed description thereof will be omitted. As shown in FIG. 3, the semiconductor laser excitation solid laser device 100C according to the present embodiment comprises a beam splitter 11 for branching a laser light emitted from the semiconductor laser excitation solid laser 2 into a first light LC' and a second light LO'; a first linear polarizer 14A for taking out a linearly polarized light from the first light LC' branched by the beam splitter 11 to form a control light LC; a second linear polarizer 14B for taking out a linearly polarized light from the second light LO' branched by the beam splitter 11 to form an output light LO; a light reception element 12 for detecting the light quantity of the control light LC transmitted through the first linear polarizer 14A; and control means 13 for controlling the light quantity of the laser light emitted from the semiconductor laser excitation solid laser 2 so that the light quantity detected by the light reception element 12 will be constant.

The kinds of the first linear polarizer 14A and the second linear polarizer 14B are not particularly limited as long as they can take out a linearly polarized light from a light having the same wavelength as the above-described laser light. However, the first linear polarizer 14A and the second linear polarizer 14B are disposed so that the polarization direction (the direction of the transmittance axis) of the first linear polarizer 14A and the polarization direction (the direction of the transmittance axis) of the second linear polarizer 14B will be identical to each other. Here, after the linearly polarized light is taken out by the first and second linear polarizers 14A, 14B, the above-described linearly polarized light may be converted into a circularly polarized light or an elliptically polarized light by a suitable retardation plate. In other words, as long as the first linear polarizer 14A is disposed on the side nearest to the beam splitter 11, a circular polarizing plate or an elliptic polarizing plate obtained by laminating the first linear polarizer 14A and the retardation plate in place of the stand-alone first linear polarizer 14A can be used. The same applies to the second linear polarizer 14B as well.

As described above, according to the control device 1C according to the present embodiment, after the laser light emitted from the semiconductor laser excitation solid laser 2 is branched into the first light LC' and the second light LO' by the beam splitter 11, light having the same polarization direction with each other is taken out respectively from the first light LC' by the first linear polarizer 14A and from the second light LO' by the second linear polarizer 14B so as to form the control light LC and the output light LO, respectively. Therefore, even when the polarization characteristic of the laser light emitted from the semiconductor laser excitation solid laser 2 changes by a temperature change or the like, the output light LO and the control light LC will have the same polarization direction with each other, so that the light quantity ratio of the output light LO to the control light LC will be approximately constant because the transmittance and the reflectivity of the beam splitter 11 are constant relative to the above-described light having the same polarization direction. Therefore, when the light quantity of the laser light emitted from the semiconductor laser excitation solid laser 2 is controlled by the controlling means 13 so that the light quantity of the control light LC detected by the light reception element 12 will be constant, the light quantity of the output light LO, which has an approximately constant light quantity ratio to the control light LC, can be stabilized to be approximately constant.

Here, in the first to third embodiments described above, a construction has been described in which the light reflected by the beam splitter 11A, 11 is used as the control light LC and the light transmitted through the beam splitter 11A, 11 is used as the output light LO. However, the present invention is not limited to this alone, so that a construction can be conversely adopted in which the light transmitted through the beam splitter 11A, 11 is used as the control light LC and the light reflected by the beam splitter 11A, 11 is used as the output light LO.

Hereafter, the characteristic features of the present invention will be made further clearer by showing Examples and Comparative Examples.

Example 1

With use of a control device 1A having a schematic construction shown in FIG. 1, a test for stabilizing the light quantity of the output light of a semiconductor laser excitation solid laser 2 was carried out.

As the semiconductor laser excitation solid laser 2, one was used in which a $YVO_4$ crystal which is a solid laser medium doped with neodymium (Nd) (Nd:$YVO_4$ crystal) was excited with use of a semiconductor laser (wavelength of 808 nm), and the light thus obtained was converted into a harmonics wave with use of a non-linear optical crystal to be emitted as a laser light of green color (wavelength of 532 nm).

As the beam splitter 11A, one in which a white plate float glass having a thickness of 0.5 mm was used as a base material, and a dielectric multiple-layer film having a five-layer construction was formed on the surface of the base material by the vapor deposition method was used. Then, the beam splitter 11A was disposed so that the normal line direction of the base material surface and the optical axis of the semiconductor laser excitation solid laser 2 (the emission direction of the laser light) would form an angle of about 45°. The film thickness of each layer of the dielectric multiple-layer film was designed so that the transmittance/reflectivity of the S-polarized light and the P-polarized light at the wavelength of 532 nm would be equivalent to each other in the above-described placement condition. The beam splitter 11A actually obtained had an average (average when the light in various polarization directions was transmitted) transmittance of 50% and the minimum transmittance/maximum transmittance=0.98 at the wavelength of 532 nm. Also, it had an average (average when the light in various polarization directions was reflected) reflectivity of 50% and the minimum reflectivity/maximum reflectivity=0.98 at the wavelength of 532 nm.

Then, change in the light quantity of the output light LO was evaluated in the case in which the atmosphere temperature was changed from 15° C. to 35° C.

Example 2

With use of a control device 1B having a schematic construction shown in FIG. 2, a test for stabilizing the light quantity of the output light of a semiconductor laser excitation solid laser 2 was carried out.

The semiconductor laser excitation solid laser 2 identical to that of the Example 1 was used. Also, as the beam splitter 11, a general beam splitter having the following specification was used.

The beam splitter had a transmittance of 53% and a reflectivity of 47% for the P-polarized light at the wavelength of 532 nm.

The beam splitter had a transmittance of 76% and a reflectivity of 24% for the S-polarized light at the wavelength of 532 nm.

The beam splitter was provided with a back surface AR coat.

As the linear polarizer (linear polarizing plate) 14, one having a single-body transmittance of 30% and a quenching ratio of 10:1 at the wavelength of 532 nm was used.

Then, in the same manner as in the Example 1, change in the light quantity of the output light LO was evaluated in the case in which the atmosphere temperature was changed from 15° C. to 35° C.

Example 3

With use of a control device 1C having a schematic construction shown in FIG. 3, a test for stabilizing the light quantity of the output light of a semiconductor laser excitation solid laser 2 was carried out.

The semiconductor laser excitation solid laser 2 and the beam splitter 11 identical to those in the Example 1 were used. First and second linear polarizers (linear polarizing plates) 14A, 14B identical to the linear polarizer 14 of the Example 2 were used. Then, the first linear polarizer 14A and the second linear polarizer 14B were disposed so that the polarization direction (the direction of the transmittance axis) of the first linear polarizer 14A and the polarization direction (the direction of the transmittance axis) of the second linear polarizer 14B would be identical to each other.

Then, in the same manner as in the Example 1 and the Example 2, change in the light quantity of the output light LO was evaluated in the case in which the atmosphere temperature was changed from 15° C. to 35° C.

Example 4

A test similar to that of the Example 2 was carried out except that the beam splitter 11A of the Example 1 was used in place of the general beam splitter 11.

Example 5

A test similar to that of the Example 3 was carried out except that the beam splitter 11A of the Example 1 was used in place of the general beam splitter 11.

Comparative Example

A test similar to that of the Example 1 was carried out except that the general beam splitter 11 of the Example 2 and the Example 3 was used in place of the beam splitter 11A.

EVALUATION RESULTS

Table 1 shows the maximum value, the minimum value, and the ratio of the maximum value to the minimum value of the light quantity of the output light LO as measured by changing the atmosphere temperature from 15° C. to 35° C. with regard to the Examples 1 to 5 and the Comparative Example.

TABLE 1

|  | maximum value (mW) | minimum value (mW) | maximum value/minimum value |
|---|---|---|---|
| Example 1 | 3.37 | 3.10 | 1.09 |
| Example 2 | 0.97 | 0.92 | 1.05 |
| Example 3 | 1.59 | 1.56 | 1.02 |
| Example 4 | 0.90 | 0.90 | 1.00 |
| Example 5 | 1.48 | 1.48 | 1.00 |
| Comparative Example | 0.86 | 0.30 | 2.87 |

As shown in Table 1, it has been found out that, with regard to all of the Examples 1 to 5, the light quantity of the output light LO can be stabilized to a great extent as compared with the Comparative Example.

The invention claimed is:

1. A semiconductor laser excitation solid laser device, comprising:
a semiconductor laser excitation solid laser with use of a non-linear optical crystal; and
a control device for stabilizing a light quantity of an output light of the semiconductor laser excitation solid laser,
wherein said control device comprises
a beam splitter for branching a laser light, which is emitted from the semiconductor laser excitation solid laser and is converted into a harmonics wave with use of the non-linear optical crystal, into the output light and a control light, the ratio of the obtained minimum transmittance to the obtained maximum transmittance being 0.8 or higher and the ratio of the obtained minimum reflectivity to the obtained maximum reflectivity being 0.8 or higher when a light having the same wavelength as the laser light emitted from the semiconductor laser excitation solid laser is incident into said beam splitter by changing the polarization direction thereof to various directions;
a light reception element for detecting the light quantity of the control light branched by said beam splitter; and
control means for controlling the light quantity of the laser light emitted from said semiconductor laser excitation solid laser so that the light quantity detected by said light reception element will be constant.

2. A semiconductor laser excitation solid laser device, comprising:
a semiconductor laser excitation solid laser with use of a non-linear optical crystal and with no use of a temperature controller; and
a control device for stabilizing a light quantity of an output light of the semiconductor laser excitation solid laser,
wherein said control device comprises
a linear polarizer for taking out a linearly polarized light from a laser light emitted from the semiconductor laser excitation solid laser and converted into a harmonics wave with use of the non-linear optical crystal;
a beam splitter for branching a light transmitted through said linear polarizer into the output light and a control light;
a light reception element for detecting the light quantity of the control light branched by said beam splitter; and
control means for controlling the light quantity of the laser light emitted from said semiconductor laser excitation solid laser so that the light quantity detected by said light reception element will be constant.

3. A semiconductor laser excitation solid laser device, comprising:
a semiconductor laser excitation solid laser with use of a non-linear optical crystal; and
a control device for stabilizing a light quantity of an output light of the semiconductor laser excitation solid laser,
wherein said control device comprises
a beam splitter for branching a laser light, which is emitted from the semiconductor laser excitation solid laser and is converted into a harmonics wave with use of the non-linear optical crystal, into a first light and a second light;
a first linear polarizer for taking out a linearly polarized light from the first light branched by said beam splitter to form a control light;
a second linear polarizer for taking out a linearly polarized light from the second light branched by said beam splitter to form the output light, a polarization direction of said first linear polarizer and a polarization direction of said second linear polarizer being identical to each other;
a light reception element for detecting the light quantity of the control light transmitted through said first linear polarizer; and
control means for controlling the light quantity of the laser light emitted from said semiconductor laser excitation solid laser so that the light quantity detected by said light reception element will be constant.

4. An image formation device comprising the semiconductor laser excitation solid laser device according to claim 1.

5. An image formation device comprising the semiconductor laser excitation solid laser device according to claim 2.

6. An image formation device comprising the semiconductor laser excitation solid laser device according to claim 3.

* * * * *